United States Patent [19]

Hershkowitz et al.

[11] Patent Number: 5,032,205
[45] Date of Patent: Jul. 16, 1991

[54] PLASMA ETCHING APPARATUS WITH SURFACE MAGNETIC FIELDS

[75] Inventors: Noah Hershkowitz; Moo-Hyun Cho, both of Madison, Wis.

[73] Assignee: Wisconsin Alumni Research Foundation, Madison, Wis.

[21] Appl. No.: 347,844

[22] Filed: May 5, 1989

[51] Int. Cl.$^5$ .......................................... H01L 21/00
[52] U.S. Cl. ..................... 156/345; 156/643; 156/646; 204/298.34; 204/298.37
[58] Field of Search .................. 156/345, 643, 646; 427/53; 118/657, 723; 204/298.37, 298.34, 298.06, 298.08, 298.16

[56] References Cited

U.S. PATENT DOCUMENTS

| | | |
|---|---|---|
| 4,119,688 | 10/1978 | Hiraoka ........................ 156/345 |
| 4,380,488 | 4/1983 | Reichelderfer et al. ......... 156/345 |
| 4,422,896 | 12/1983 | Class et al. .................... 156/345 |
| 4,482,419 | 11/1984 | Tsukada et al. ............ 204/298 EM |
| 4,483,737 | 11/1984 | Mantei .......................... 156/643 |
| 4,492,610 | 1/1985 | Okano .......................... 156/345 |
| 4,600,492 | 7/1986 | Ooshio et al. ............ 204/298 EM |
| 4,632,719 | 12/1986 | Chow et al. ................... 156/345 |
| 4,657,619 | 4/1987 | O'Donnell ..................... 156/345 |
| 4,745,337 | 5/1989 | Pichot et al. .................. 156/345 |
| 4,761,219 | 8/1988 | Sasaki et al. .................. 156/345 |
| 4,769,101 | 9/1988 | dos Santos Perciro Ribeiro ......................... 156/345 |
| 4,776,918 | 10/1988 | Otsubo et al. ................. 118/728 |
| 4,778,561 | 10/1988 | Ghanbari ...................... 156/345 |
| 4,838,978 | 6/1989 | Sekine et al. .................. 156/345 |
| 4,842,679 | 6/1989 | Kudo et al. ................... 156/643 |
| 4,842,707 | 6/1989 | Kinoshita ...................... 156/345 |
| 4,846,928 | 7/1989 | Dolins et al. ................... 156/643 |
| 4,878,995 | 11/1989 | Arikado et al. ................ 156/345 |
| 4,901,667 | 2/1990 | Suzuki et al. .................. 156/345 |

OTHER PUBLICATIONS

Vossen et al, *Thin Film Processes*, Academic Press, N.Y., 1978, pp. 16–17 and 88–89.
"Planar Magnetron Sputtering Cathode with Deposition Rate Distribution Controllability," *Thin Solid Films*, 1982, pp. 225–233.
"Plasma Etching in a Multipolar Discharge," *Journal of Applied Physics*, vol. 57(5), Mar. 1985, pp. 1638–1647.

*Primary Examiner*—David A. Simmons
*Assistant Examiner*—Thi Dang
*Attorney, Agent, or Firm*—Quarles & Brady

[57] ABSTRACT

A glow discharge etching apparatus includes a magnetic assembly for creating a surface magnetic field in close proximity to the walls of an etching chamber. An electrode is located within the chamber for supporting the object to the etched. A radio frequency signal is applied to the electrode so that it will emit secondary electrons upon bombardment by ions from an etching plasma created within the apparatus. A control plate may be positioned at various locations within the apparatus to regulate the amount of electron leakage to the control plate and thereby regulate the etching process. This apparatus provides improved uniformity and directionality of etching due to a low gas pressure and the surface magnetic field.

16 Claims, 4 Drawing Sheets

PLASMA ETCHING APPARATUS WITH SURFACE MAGNETIC FIELDS

This invention was made with United States government support awarded by the National Science Foundation (NSF), Grant number(s): ESC-8704529. The United States Government has certain rights in this invention.

BACKGROUND OF THE INVENTION

The present invention relates to plasma discharge etching equipment of the type which is often used to process semiconductor wafers.

Plasma discharge devices have been employed for some time to etch wafers for integrated circuits and other semiconductor devices. This plasma etching apparatus has a chamber which is evacuated and into which an ionizable gas then is introduced. A pair of opposing electrodes within the chamber are excited by a radio frequency signal to produce a glow discharge plasma between the electrodes. The plasma of gas ions is created by ionizing electrons colliding with the gas atoms or molecules within the chamber. The ionizing electrons are produced by the impingement of gas ions on the semiconductor wafer and its supporting electrode causing a secondary emission of electrons from those objects. These secondary electrons also collide with gas atoms or molecules in the chamber generating additional ions and a sustained plasma.

The charged ions are accelerated toward one of the electrodes on which the semiconductor wafer to be etched is placed. A combination of the force of the ions striking the wafer and chemical processes erodes the wafer material. A mask may be deposited on the surface of the wafer so that the erosion is confined to areas which are not covered by the mask.

The ionizable gas within the etching apparatus typically is maintained at a relatively high pressure in order to maximize the probability that ionizing electrons will strike a gas atom or molecule. Previous devices maintained a very close separation between the two electrodes to increase the plasma density for a fixed input power and gas pressure. However, a minimum electrode separation has to be observed so that the separation is greater than the ionization mean free path of the electrons. Therefore, a trade off in the separation distance between the two electrodes exists whereby a close separation is desirable from a plasma confinement standpoint, while a larger separation is required in order to increase the probability that an electron will travel a sufficient distance to collide with a gas atom or molecule. Low pressure is also desirable because it results in better directionality of etching as a result of the absence of energetic ion collisions. Furthermore it is desirable to have as large and uniform a plasma as possible in order to etch large wafers and produce more semiconductor devices per etching operation.

SUMMARY OF THE INVENTION

A plasma discharge apparatus includes a chamber having a plurality of walls within which an etching operation occurs. The apparatus also includes a means for introducing an ionizable gas into the chamber. An electrode assembly, which can consist of a single electrode, within the apparatus is biased with respect to the walls of the chamber so as to produce secondary electron emission upon bombardment by gas ions. The collision of the emitted electrons with gas atoms or molecules creates a sustained glow discharge plasma within the chamber. An object to be etched is placed o the electrode assembly and also is bombarded by the plasma ions.

A magnet assembly produces a surface magnetic field inside the chamber in close proximity to the chamber walls. This magnetic field reflects electrons which would otherwise strike the walls and thereby increases the effective chamber size. This effect enables the apparatus to be operated with a lower gas pressure and with an effective increased electrode spacing, thus permitting larger substrates to be etched.

In the preferred embodiment the magnet assembly which establishes the surface magnetic field comprises a multi-dipole magnetic structure. For example, this assembly typically includes a plurality of permanent magnets extending around the chamber at spaced increments. The magnetic poles of these magnets alternate around the periphery of the chamber to create a series of magnetic dipoles adjacent to the chamber walls.

An embodiment of the present invention also includes a control electrode which is adjacent and electrically connected to one of the etching chamber walls. This control electrode is adjustable allowing it to be spaced at varying distances from that chamber wall. By varying this distance, the control electrode can be located in different intensity regions of the magnetic fields produced by the multi-dipole magnet assembly. For example, when the control electrode is relatively close to the chamber wall, virtually all of the electrode surface is covered by relatively strong regions of the magnetic fields. Therefore, the vast majority of electrons traveling in a trajectory toward the control electrode, will be reflected by the magnetic fields within which the control electrode lies. When the control electrode is more remote from the chamber wall, a portion of its surface will be in relatively weak regions of the magnetic fields, allowing a significant number of electrons to strike the control electrode and not be reflected back into the plasma. The adjustment of the control electrode spacing alters the loss of electrons within the chamber and affects the rate of etching by changing the plasma density and by changing the energy of ions impinging on the wafer to be etched.

DETAILED DESCRIPTION OF THE INVENTION

Figure 1:
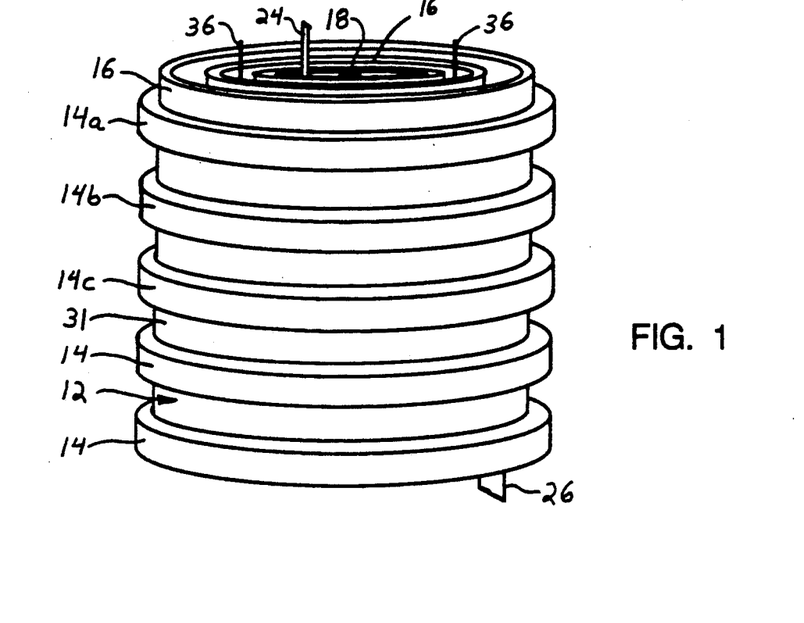
FIG. 1 is an isometric view of one embodiment of an etching apparatus according to the present invention.
Figure 2:
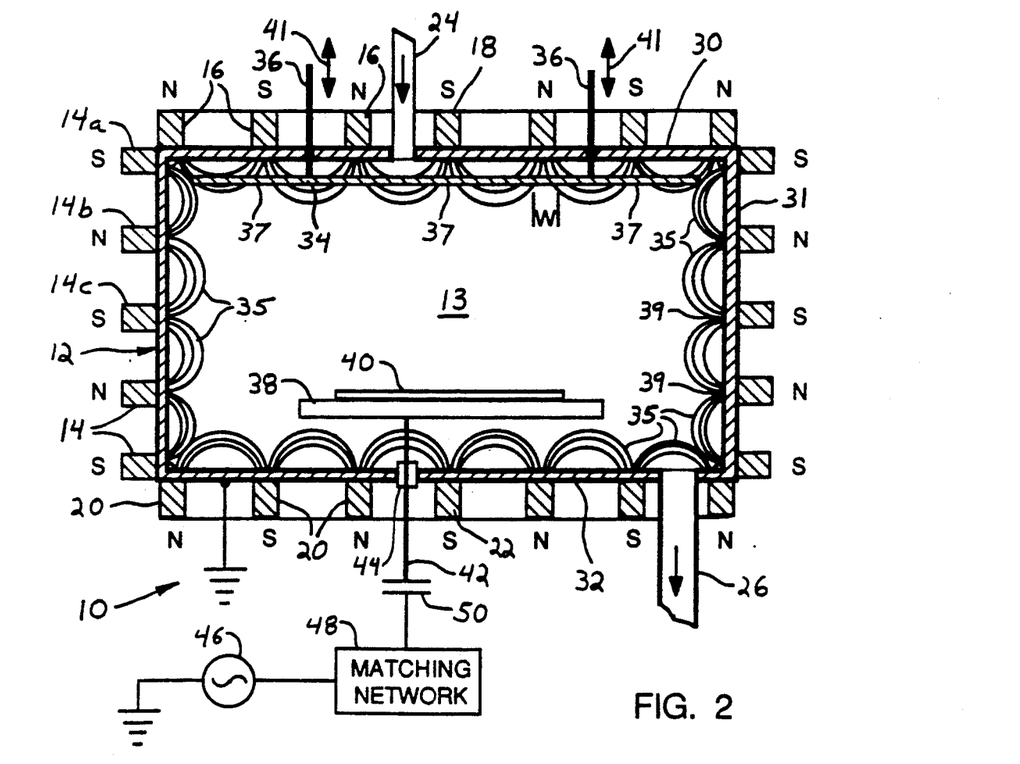
FIG. 2 is a radial cross section of the apparatus in FIG. 1.

With reference to FIGS. 1 and 2, a first embodiment of an etching apparatus 10 comprises a cylindrical etching chamber 12 formed by a circular cylindrical sidewall 31 and two planar top and bottom walls 30 and 32, respectively. The chamber walls 30, 31, and 32 are formed of an electrically conductive material which allows the penetration of a magnetic field. The walls of the chamber 12 are connected to ground, thereby acting as an anode electrode of the apparatus. The etching chamber further includes a gas inlet port 24, an exhaust port 26, and an access port (not shown) through which the objects to be etched may be inserted into and removed from the etching chamber 12.

A surface magnetic field is created in proximity to the walls 30-32 by an assembly of permanent magnets 14, 16, 18, 20, and 22 surrounding the chamber 12. Specifically, five annular permanent magnets 14 extend around the cylindrical sidewall 31, spaced along the wall's longitudinal axis. A multi-dipole surface magnetic field is formed by the magnets 14 presenting alternating north and south poles toward the chamber. For example, magnet 14a presents a north pole along its inner diameter surface which is adjacent to the cylindrical wall 13 of the chamber. The letter S next to the outer diameter surface of magnet 14a denotes that the south magnetic pole is at that outer surface. The next annular permanent magnet 14b has a south pole along its inner diameter surface. The third magnet 14c presents a north magnet pole around its inner diameter surface; and so on along the longitudinal axis of the cylindrical wall 31.

Figure 3:
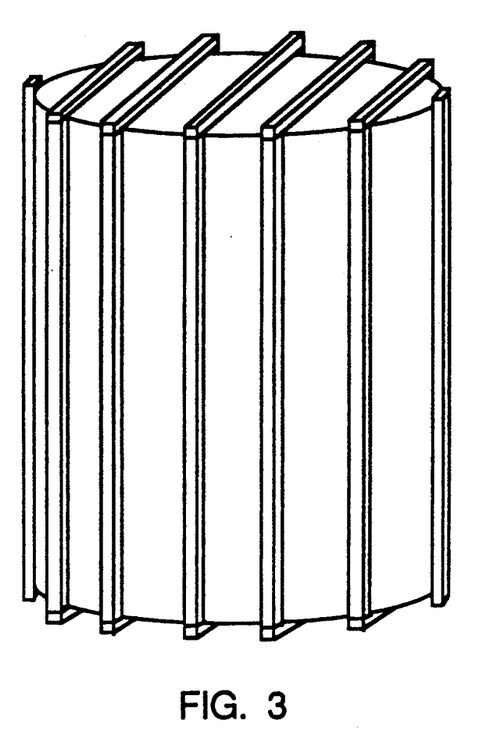
FIG. 3 is an isometric view of another embodiment of an etching apparatus which incorporates the present invention.

Three coaxial annular permanent magnets 16 are located on the exterior of and adjacent to the chamber top wall 30. At the center of the top wall 30 and of the coaxial magnets 16 is a cylindrical permanent magnet 18. The upper coaxial magnets 16 and 18 form a multi-dipole surface magnetic field along the interior of the chamber top wall 30. That is, the magnetic poles at the lower surfaces of the upper magnets 16 and 18 alternate between the north and south magnetic poles. A similar set of lower coaxial annular permanent magnets 20 are positioned adjacent to the exterior surface of the chamber bottom wall 32. A cylindrical permanent magnet 22 is located at the center of the bottom wall which is also at the coaxial center for the lower magnets 20. As with the magnet rings for the upper wall, the surface of the magnetic rings adjacent the bottom wall 32 alternate between south and north magnetic poles. As is apparent from the cross section drawing of FIG. 2, the magnetic poles presented toward the chamber 12 alternate going around the chamber. Even though permanent magnets are used in the embodiments described herein, a multi-dipole assembly of electro-magnets can be used to generate the surface magnetic field Although a circular cylindrical chamber 12 is illustrated for the embodiment of FIGS. 1 and 2, the present invention is not limited to that shape. The chamber 12 may also be rectangular, or box-like, in shape. In this case, the permanent magnets would have a rectangular annular form. As a further alternative, the permanent magnet structure can be formed by a series of straight magnet bars surrounding the chamber as depicted in FIG. 3.

Referring again to the embodiment in FIG. 2, the combined surface magnetic field created within the chamber 12 by the multi-dipole magnet assembly is schematically represented by the curved lines 35. This field has a plurality of cusps 39 which are aligned with the midpoints of the interface between the magnets 14-22 and the associated wall 30-32 of chamber 12. The magnetic field strength in the cavity adjacent each cusp is negligible for practical purposes. As a consequence, although the majority of ionizing electrons in the cavity will be reflected away from the chamber walls by the surface magnetic field, a few will strike the walls at the cusps 39.

The surface magnetic field is confined to the region immediately adjacent the chamber walls 30, 31, and 32. That is, the magnetic field within the chamber 12 decreases to substantially zero field strength at a distance approximately equal to the magnets separation distance from the chamber walls, for example. The number of permanent magnets surrounding the etching chamber 12 has been chosen for ease of illustration. A different number of magnets may be provided to optimize the depth of magnetic field penetration into the chamber cavity 13.

With continuing reference to FIG. 2, a control plate 34 is located adjacent to the upper wall 30 within the etching chamber. The control plate 34 is mounted on two control rods 36 which extend through the top wall 30 and electrically couple the control plate to the grounded chamber 12. The control plate 34 extends into the magnetic field produced by the upper permanent magnets 16 and 18. Ring-shaped areas 37 of the control plate surface are located in the regions of negligible magnetic field strength parallel to the surface associated with each cusp 39 so as to be exposed to bombardment by ionizing electrons within the cavity 13. The width of one of the exposed surface areas 37 of the control plate is indicated by the distance W on the figure. By inserting and extracting the control rods 36 to and from the chamber cavity 13 as indicated by arrows 41, the position of the control plate 34 within the magnetic field may be varied. As the distance between the control plate 34 and the top chamber wall 30 changes, the width of these exposed surface areas 37 also changes. Specifically, the width W of the exposed areas decreases with the decrease in the spacing between the wall 30 and the control plate. Similarly, as the wall to control plate spacing increases, so does the width W of each exposed ring-shaped area 37 on the control plate surface. The significance of varying the size of the exposed areas will become apparent subsequently.

Also located within the chamber 12 is a planar electrode 38. An electrical lead 42 extends from his electrode through an insulation grommet 44 in the bottom wall 32 of the chamber. A source 46 of a radio frequency signal is coupled between ground and the lead 42 by an impedance matching network 48 and a DC blocking capacitor 50.

Prior to operating the etching apparatus 10, a substrate 40 is prepared using conventional techniques by applying a mask to one surface to define the etching pattern. The prepared substrate 40 is placed in the chamber 12 onto the electrode 38. The chamber is then sealed and a vacuum pump (not shown), which is connected to the exhaust port 26, is activated to evacuate the chamber. After the chamber has been evacuated, an ionizable etching gas, such as carbon tetrafluoride, is introduced into the chamber via the inlet port 24 until the pressure of the etching gas reaches approximately one mtorr.

The radio frequency source 46 then is energized to apply a 13.56 MHz signal at several hundred volts between the electrode 38 and the walls of chamber 12. As is well known, the radio frequency excitation introduces ionizing electrons into the chamber which collide with the etching gas atoms creating ions, thereby creating a plasma within the chamber. Once the plasma has been formed, the pressure of the etching gas may be reduced to 0.05-0.07 mtorr. In this manner, a sustained glow discharge is created, whereby the gas ions from the plasma striking the surface of electrode 38 produce a secondary emission of electrons which in turn collide with atoms to generate additional ions for the plasma. Some of the ions from the plasma will strike the portions of the surface of the substrate 40, which are exposed by the mask, thereby etching the exposed substrate material. Electrons traveling toward the walls 30-32 of the chamber 12 will be reflected toward the interior of the chamber cavity 13 by the surface magnetic field adjacent to the walls. A few electrons will strike chamber walls 32 and 32 at the cusps 39. Electron leakage occurs at the exposed areas 37 of the control plate 34 which lie in the regions of negligible magnetic field strength parallel to the control plate. As a consequence, these exposed regions 37 act as mini-anodes to which electrons leak rather than being reflected by the surface magnetic field adjacent to the top wall 30.

When the control rods 36 are fully retracted from the chamber and the control plate 34 abuts the top wall 30, the width W of the exposed areas 37 of the control plate will be reduced to a minimum, approximating the width of the cusps 39. In this orientation of the control plate 34, the leakage of electrons is minimized. Alternatively, when the control rods 36 are pushed into the etching chamber 12, the control plate moves away from the top wall 30 and the width W of the exposed surface areas 37 increases. This alteration of the size of the exposed surface areas 37 changes the effective grounded boundary area of the chamber 12 resulting in increased electron leakage. The change in electron leakage has a corresponding effect on the plasma density and the energy of ions impinging on the wafer to be etched, and thus on the rate of etching, allowing fine tuning of the process. The relative effect of the change in position of the control plate 34 depends upon the bias potential between the electrode 38 and control plate 34, and the profile of the surface magnetic field.

As a result, the first embodiment of the present invention illustrated in FIG. 2 provides a mechanism whereby the user can control the etching process by regulating the amount of electron leakage to the walls of the chamber. Alternatively, when a rectangular etching chamber is employed, additional control plates may be incorporated adjacent to the sidewalls to provide further means for controlling the electron leakage and the etching process.

Figure 4:
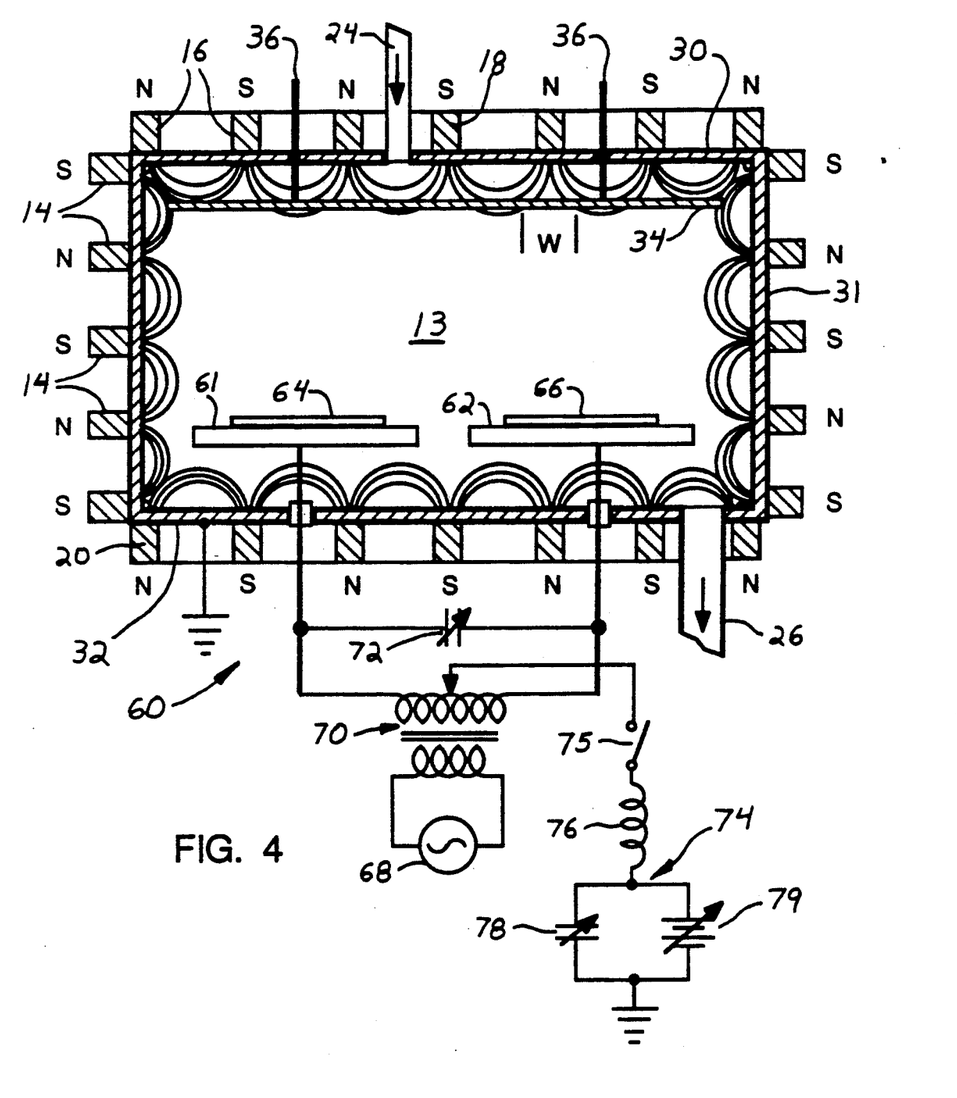
FIG. 4 is a cross section similar to that in FIG. 2 of an etching apparatus having a different electrode assembly.

FIG. 4 shows a second embodiment of the present invention which is incorporated in an etching apparatus 60. The elements of this apparatus 60 that are similar to those in the first embodiment have been assigned like reference numerals. For example, the etching chamber 12 consists of a curved sidewall 31 with upper and lower walls 30 and 33, respectively. The chamber 12 is surrounded by a plurality of permanent magnets 14-22 forming a multi-dipole surface magnetic field adjacent to the walls of the chamber. In addition, the second etching apparatus 60 has a control plate 34 supported by two control rods 36 which extend through apertures in the to wall 30.

However, the electrode assembly and the RF biasing circuit are different in the second etching apparatus 60. Specifically, two substantially coplanar electrodes 61 and 62 are positioned within the chamber cavity 13 and support two separate substrates 64 and 66 to be etched. The radio frequency excitation signal is supplied by a source 68 which is coupled to the primary winding of an impedance matching transformer 70. The secondary winding of the transformer 70 is coupled between the two electrodes 61 and 62. A variable capacitor 72 is also coupled between the two electrodes 61 and 62 to aid in matching the impedance of the chamber to the radio frequency source 68.

Because the RF signal is applied between the two electrodes 61 and 62, the potential of these electrodes will float with respect to the ground potential of the chamber walls 30-32. Alternatively, the electrodes 61 and 62 can be biased with respect to ground by a DC bias source 74. The source 74 consists of a switch 75 which couples a tap of the secondary winding of transformer 70 to a RF choke 76. A DC supply 79 and a parallel coupled RF shunt capacitor 78 connect the choke 76 to ground. A variable DC supply 79 can be used allowing the bias to be varied. Alternatively, the polarity of the DC supply can be reversed from that illustrated. If the etching apparatus 60 is to be operated in a mode in which the electrodes 61 and 62 float with respect to the chamber walls, switch 75 is opened; otherwise the electrodes may be biased with respect to the walls of the chamber 12 by closing switch 75.

The second etching apparatus 60 provides a balanced dual electrode configuration enabling two substrates 64 and 66 to be etched at a time. This latter configuration is believed to result in smaller fluctuations in the potential of the plasma within the chamber as compared with the apparatus in FIG. 1. However, external radio frequency shielding is required for this second etching apparatus 60.

As discussed above with respect to the first embodiment 10 of the present invention, the etching rate of the second apparatus 60 is governed by regulating the position of the control plate 34. As shown in FIG. 4, the control plate 34 is positioned farther away from the top wall 30 than the control plate 34 illustrated in the FIG. 2 embodiment, thereby increasing the width W of the exposed surface areas of the control plate.

Figure 5:
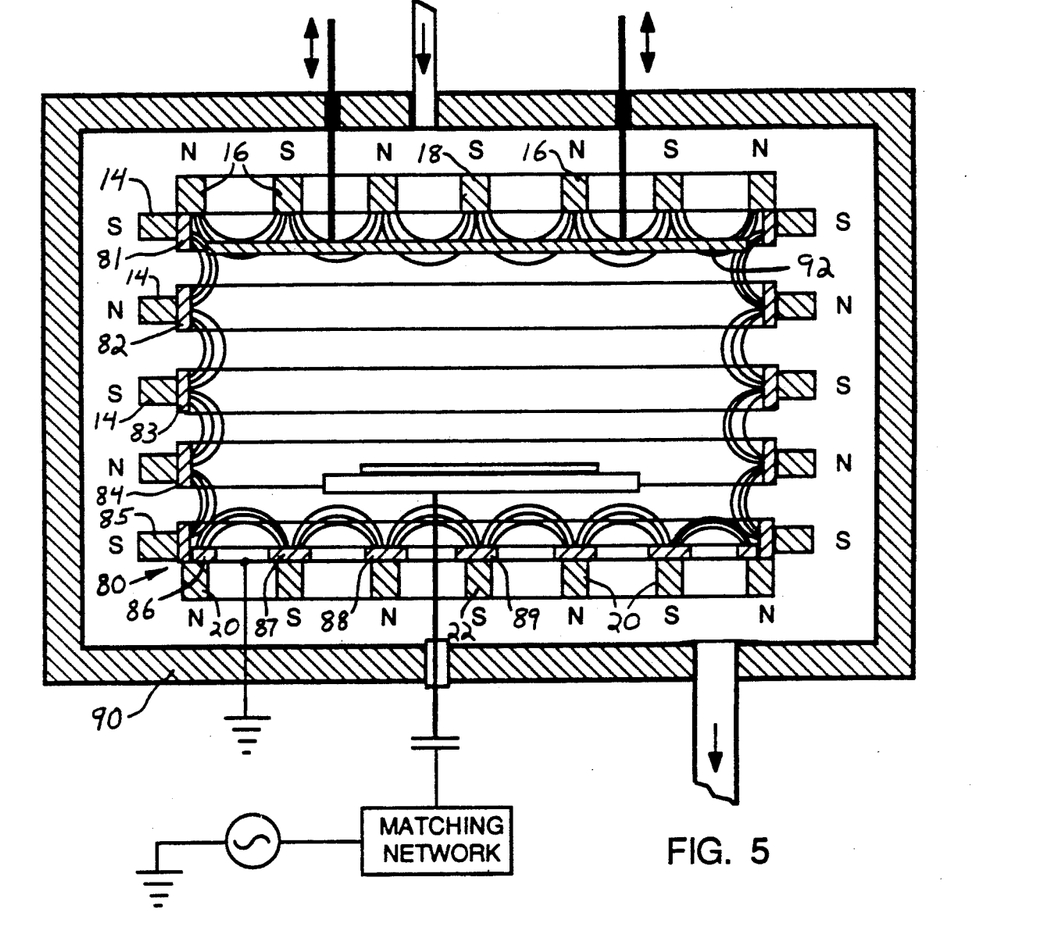
FIG. 5 is a cross section of another embodiment of an etching apparatus according to the present invention.

In order to achieve the proper surface magnetic field, the walls of the etching chamber must be sufficiently thin to allow the proper degree of magnetic field penetration. In some instances, the desired wall thickness may be too thin to adequately withstand the external atmospheric pressure exerted on the evacuated chamber. In this situation, an etching chamber 80 can be placed within a separate vacuum chamber 90, as shown in FIG. 5. The atmospheric pressure is resisted by the outer vacuum chamber 90, and the surface magnetic field is provided by the magnet assembly comprising magnets 14-22 as in the previous embodiments.

Furthermore as the etching chamber 80 in this alternative does not have to be a sealed structure, it can have walls only where electrons are likely to strike the chamber boundary, i.e. at the magnetic field cusps. Therefore etching chamber 80 is defined by a plurality of aligned cylindrical rings 81-85, which form a side boundary wall of the etching chamber. Each cylindrical ring 81-85 is positioned adjacent to one of the coaxial annular magnets 14. A bottom boundary wall of the etching chamber 80 is formed by three concentric rings 86-88 and a central disk 89 which are adjacent to the lower magnets 20 and 22. The cylindrical rings 81-85, concentric rings 86-88, and central disk 89 are all electrically connected to ground. Since electrons traveling upward either will be reflected by the magnetic field or will strike a control plate 92, the top wall of the previous embodiments has been removed. The upper boundary of the etching chamber 80 is defined by the upper edge of the top cylindrical ring 81.

Since electron leakage occurs at the magnetic field cusps 88, it is undesirable to place just the permanent magnets within the vacuum chamber without the etching chamber rings 81-88. Conventional permanent magnets may be electrically insulating and not suitable to act as an anode. Therefore the rings 81-88, disk 89, and the control plate 92 serve as an anode in this etching apparatus.

We claim:

1. An apparatus for etching a substrate comprises:
   a chamber within which the etching is to occur;
   an electrode assembly within said chamber providing a source of electrons by secondary emission;
   means for introducing an ionizable gas into said chamber;
   means for biasing said electrode assembly to cause said electrode assembly to emit secondary electrons and create a glow discharge plasma within said chamber;
   means for establishing a surface magnetic field adjacent to a boundary of said chamber to reflect electrons within said chamber, the surface magnetic field having a strength which is substantially zero within the created plasma;
   a control electrode located in the magnetic field within said chamber; and
   means for varying the location of said control electrode in the magnetic field to expose different surface areas of said control electrode to electron bombardment.

2. The apparatus as recited in claim 1 wherein:
   said electrode assembly includes first and second substantially coplanar electrodes; and
   said means for biasing said electrode assembly includes a source of a radio frequency signal, and a transformer having a primary winding to the source of a radio frequency signal and having a secondary winding coupled between the first and second electrodes.

3. The apparatus as recited in claim 2 wherein said means for biasing said electrode assembly further includes a means for applying a d.c. bias potential to said first and second electrodes.

4. The apparatus as recited in claim 1 wherein:
   said chamber has a side wall assembly and a pair of end walls; and
   said means for establishing a surface magnetic field includes a first plurality of annular permanent magnets extending around the side wall assembly, a second plurality of annular permanent magnets adjacent one of the ends walls, and a third plurality of annular permanent magnets adjacent the other of the end walls.

5. The apparatus as recited in claim 4 wherein the second plurality of annular permanent magnets are substantially coaxial to each other; and the third plurality of annular permanent magnets are substantially coaxial to each other.

6. The apparatus as recited in claim 1 wherein said means for establishing a surface magnetic field includes a plurality of annular permanent magnets extending around chamber.

7. An etching apparatus comprising:
   a chamber within which the etching is to occur, said chamber having means for defining a chamber boundary;
   an electrode assembly within said chamber for supporting an object to be etched;
   means for introducing an ionizable gas into said chamber;
   means for biasing said electrode assembly thereby causing said electrode assembly to emit secondary electrons and create a flow discharge plasma within said chamber;
   means for establishing a surface magnetic field adjacent to the chamber boundary to reflect electrons within said chamber; and
   a control electrode adjacent the chamber boundary, and having means for varying the distance that said control electrode is spaced from a portion of the chamber boundary.

8. The apparatus as recited in claim 7 wherein:
   said electrode assembly includes first and second substantially coplanar electrodes; and
   said means for biasing said electrode assembly includes a source of a radio frequency signal, a transformer having a primary winding coupled to the source of a radio frequency signal and having a secondary winding coupled to the first and second electrodes.

9. The apparatus as recited in claim 8 wherein said means for biasing said electrode assembly further includes a means for applying a d.c. bias potential between said first and second electrodes and the walls of said chamber.

10. The apparatus as recited in claim 7 wherein said means for establishing a surface magnetic field includes a plurality of annular magnets extending around said chamber.

11. The apparatus as recited in claim 7 wherein:
    said means for defining a chamber boundary has a side wall assembly and an end wall; and
    said means for establishing a surface magnetic field includes a first plurality of annular permanent magnets extending around the side wall assembly, a second plurality of annular permanent magnets adjacent the end wall.

12. A plasma discharge etching apparatus comprising:
    a chamber having electrically conductive walls within which the etching is to occur, said walls defining a boundary of said chamber;
    first and second substantially coplanar electrodes within said chamber, each electrode for supporting a separate object to be etched;
    means for introducing an ionizable gas into said chamber;
    means for biasing said first and second electrodes enabling the electrodes to emit secondary electrons and create a glow discharge plasma within said chamber, said means for biasing including a source of a radio frequency signal, a transformer having a primary winding coupled to the source of a radio frequency signal and having a secondary winding coupled to the first and second electrodes; and
    a magnet assembly for establishing a surface magnetic field adjacent to the boundary of said chamber to reflect electrons within said chamber away from the boundary, the surface magnetic field having a strength which is substantially zero within the created plasma.

13. The apparatus as recited in claim 12 wherein said means for biasing further includes a means for applying a d.c. bias potential between said first and second electrodes and the walls of said chamber.

14. A plasma discharge etching apparatus comprising:
- a chamber having electrically conductive walls within which the etching is to occur, said walls defining a boundary of said chamber;
- first and second substantially coplanar electrodes within said chamber, each electrode for supporting a separate object to be etched;
- a control electrode substantially parallel to a portion of the chamber boundary, and having means for varying the distance that said control electrode is spaced from the portion of the chamber boundary;
- means for introducing an ionizable gas into said chamber;
- means for biasing said first and second electrodes enabling the electrodes to emit secondary electrons and create a glow discharge plasma within said chamber; and
- a magnet assembly for establishing a surface magnetic field adjacent to the boundary of said chamber to reflect electrons within said chamber away from the boundary, the surface magnetic field having a strength which is substantially zero within the created plasma.

15. The apparatus as recited in claim 14 wherein magnet assembly includes a plurality of annular magnets extending around said chamber.

16. The apparatus as recited in claim 14 wherein said magnet assembly includes a first plurality of annular permanent magnets extending around side walls of said chamber, a second plurality of coaxial annular permanent magnets adjacent to an end wall of said chamber, and a third plurality of coaxial annular permanent magnets adjacent to another end wall of said chamber.

* * * * *

UNITED STATES PATENT AND TRADEMARK OFFICE
CERTIFICATE OF CORRECTION

PATENT NO. : 5,032,205

DATED : July 16, 1991

INVENTOR(S) : Noah Hershkowitz et al.

It is certified that error appears in the above-identified patent and that said Letters Patent is hereby corrected as shown below:

In Column 2, Line 3, change "o" to --on--.

In Column 5, line 60, change "to" to --top--.

In Column 8, Line 7 (Claim 7), change "flow" to --glow--.

Signed and Sealed this

First Day of December, 1992

*Attest:*

DOUGLAS B. COMER

*Attesting Officer*  Acting Commissioner of Patents and Trademarks